United States Patent
Ionescu (10) Patent No.: US 10,617,043 B2
(45) Date of Patent: Apr. 7, 2020

(54) INTEGRATED AIR COOLING AND ARC RESISTANT SYSTEM FOR MEDIUM VOLTAGE DRIVE

(71) Applicant: Siemens Aktiengesellschaft, Müchen (DE)

(72) Inventor: Bogdan Cristian Ionescu, McMurray, PA (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 138 days.

(21) Appl. No.: 15/887,483

(22) Filed: Feb. 2, 2018

(65) Prior Publication Data

US 2019/0246527 A1 Aug. 8, 2019

(51) Int. Cl.
*H05K 7/20* (2006.01)
*H01H 33/08* (2006.01)
*H02B 1/56* (2006.01)
*H02B 13/025* (2006.01)
*H02H 3/16* (2006.01)

(52) U.S. Cl.
CPC ..... *H05K 7/20909* (2013.01); *H05K 7/20145* (2013.01); *H05K 7/20172* (2013.01); *H05K 7/20181* (2013.01); *H05K 7/20572* (2013.01); *H01H 33/08* (2013.01); *H02B 1/565* (2013.01); *H02B 13/025* (2013.01); *H02H 3/16* (2013.01)

(58) Field of Classification Search
CPC ...... H01H 33/08; H02H 3/16; H05K 7/20145; H05K 7/20909; H05K 7/20172; H05K 7/20181; H02B 13/025; H02B 1/565
See application file for complete search history.

(56) References Cited

U.S. PATENT DOCUMENTS

| | | |
|---|---|---|
| 2012/0327602 A1 | 12/2012 | Kulkarni et al. |
| 2014/0157692 A1 | 6/2014 | Parizeau et al. |
| 2015/0305203 A1 | 10/2015 | Chang et al. |
| 2017/0086336 A1* | 3/2017 | Matsuoka .......... H05K 7/20181 |
| 2017/0280593 A1 | 9/2017 | Magallanes et al. |
| 2018/0323022 A1* | 11/2018 | Skibinski ............... H01H 33/08 |
| 2019/0172622 A1* | 6/2019 | Takauchi .............. H01F 27/025 |

* cited by examiner

*Primary Examiner* — Jayprakash N Gandhi
*Assistant Examiner* — Zhengfu J Feng (57) ABSTRACT

An integrated air cooling and arc resistant system is provided for a voltage drive. The system comprises a cabinet including a back, an upper portion and a lower portion. The system further comprises a plurality of power cells disposed in the cabinet. The system further comprises a central chimney vertically disposed in the cabinet. The system further comprises a transformer disposed in the cabinet and being underneath the plurality of power cells. The transformer has a top end and a bottom end. The system further comprises a vertical plenum disposed in the back of the cabinet. The vertical plenum is configured to flow cool air passing from the plurality of power cells towards the bottom end of the transformer.

13 Claims, 5 Drawing Sheets

INTEGRATED AIR COOLING AND ARC RESISTANT SYSTEM FOR MEDIUM VOLTAGE DRIVE

BACKGROUND

1. Field

Aspects of the present invention generally relate to an integrated efficient air flow cooling and arc resistant system for medium voltage power electronic equipment such as a voltage drive.

2. Description of the Related Art

An electric device or equipment, such as for example variable frequency drive (VFD), power supply, transformer or circuit breaker, is typically housed in an enclosure or cabinet. Arc faults may occur within enclosures or cabinets due to for example faulty connections or user error. An internal short circuit may result in an arc fault. Air is ionized between two or more potentials in the electric device by the arc fault, causing an arc flash comprising a plasma cloud of rapidly expanding vaporized metallic materials. The plasma causes high pressures and temperatures to build up quickly, in fractions of a second, within the enclosure.

Arc fault conditions must either be contained within the enclosure or vented to the outside of the electric device enclosure. Arc fault effects are devastating for the equipment where it occurs and secondary effects such as explosive ejection of shrapnel and toxic gases cause serious hazards for personnel. While the electric arc is burning, significant damage of components inside the cabinet occurs in part due to the uncontrolled way the arc is burning. Additionally, the electric arc has a tendency to move inside the cabinet away from the source of energy. This way the damage inside is substantial and as a rule causes permanent damage to the entire cabinet and its contents.

Further, the electric device or equipment may comprise air inlets including air filter(s) for cooling purposes, but during an arc fault event, hot gases, plasma and debris may vent out of the air inlets, which can cause serious injury or death to personnel and property. Normal air filters break down or do not filter these gases under an arc event.

In medium voltage power electronic equipment such as a voltage drive, an air cooling system is needed for a power electronic part and for a power transformer part. They are very dissimilar which leads to a parallel path for the two air flows. This is causing a problem with the balance between these two components when there is a single source of air supply. This problem is not easily solved in a nonlinear system.

Arc resistant solution is currently implemented on top of existing air cooling solution and it uses a parallel/auxiliary path to exhaust the plasma after an arc fault inside medium voltage power electronic equipment. This is causing as a rule bulkier and more expensive equipment.

Therefore, there is a need for an efficient air cooling and an improved arc resistant system for medium voltage power electronic equipment such as a voltage drive.

SUMMARY

Briefly described, aspects of the present invention relate to integrating an arc resistant solution into a modified air cooling solution using a centrally placed chimney which thus becomes a common path for both normal operation air cooling and for plasma evacuation after an arc fault. This is a solution that is using an integrated approach.

In accordance with one illustrative embodiment of the present invention, an integrated air cooling and arc resistant system is provided for a voltage drive. The system comprises a cabinet including a lower baffle and an upper baffle, a plurality of first power cells disposed in the cabinet, a plurality of second power cells disposed in the cabinet, a central chimney vertically disposed in a space between the plurality of first power cells and the plurality of second power cells. The cabinet includes an upper portion and a lower portion. The system further comprises a transformer clamped between upper clamps and lower clamps while disposed in the cabinet and being underneath the plurality of first power cells and the plurality of second power cells. The transformer has a top end and a bottom end. The system further comprises a vertical plenum disposed in a back of the cabinet. The vertical plenum is configured to flow cool air passing from the plurality of first power cells and the plurality of second power cells towards the bottom end of the transformer. The lower baffle is configured to prevent warm air from flowing from the transformer to the plurality of first power cells and the plurality of second power cells. The upper baffle is configured to force the warm air from the transformer and the cool air from the transformer into the central chimney.

In accordance with another illustrative embodiment of the present invention, an integrated air cooling and arc resistant system is provided for a voltage drive. The system comprises a cabinet including a back, an upper portion and a lower portion. The system further comprises a plurality of power cells disposed in the cabinet. The system further comprises a central chimney vertically disposed in the cabinet. The system further comprises a transformer disposed in the cabinet and being underneath the plurality of power cells. The transformer has a top end and a bottom end. The system further comprises a vertical plenum disposed in the back of the cabinet. The vertical plenum is configured to flow cool air passing from the plurality of power cells towards the bottom end of the transformer.

In accordance with another illustrative embodiment of the present invention, a method of integrating air cooling with an arc resistant system is provided for a voltage drive. The method comprises providing a cabinet including a back, an upper portion and a lower portion, providing a plurality of power cells disposed in the cabinet, providing a central chimney vertically disposed in the cabinet, providing a transformer disposed in the cabinet and being underneath the plurality of power cells, the transformer having a top end and a bottom end, providing a vertical plenum disposed in the back of the cabinet and flowing cool air that passes through the plurality of power cells towards the bottom end of the transformer.

DETAILED DESCRIPTION

To facilitate an understanding of embodiments, principles, and features of the present invention, they are explained hereinafter with reference to implementation in illustrative embodiments. In particular, they are described in the context of an air-cooled and an arc resistant medium voltage drive that integrates air cooling in an arc resistant system for the voltage drive. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
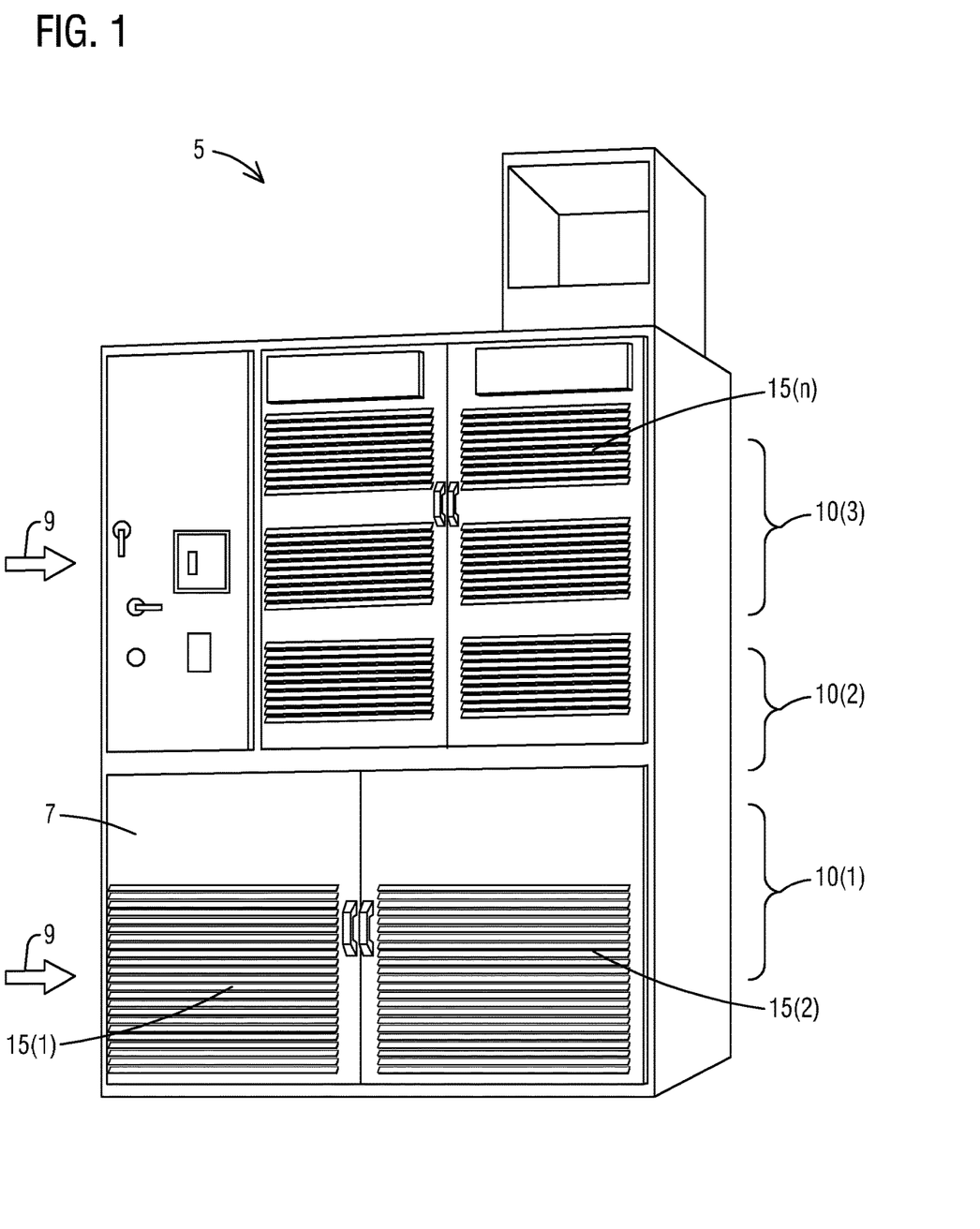
FIG. 1 illustrates a representation of a perspective view of an air-cooled and an arc resistant medium voltage drive in accordance with an exemplary embodiment of the present invention.

Consistent with one embodiment of the present invention, FIG. 1 represents a representation of a perspective view of an air-cooled and an arc resistant medium voltage drive 5. The medium voltage drive 5 comprises a cabinet or an enclosure 7. The cabinet 7 houses one or more electric devices; such as for example power supplies, transformers, circuit breakers, variable frequency drives, etc. The cabinet 7 can be for example made of metal, and can be configured for example as steel enclosure. A cooling system of the electric device may include air intakes on a front, back, and/or sides of the cabinet 7. According to FIG. 1, the cabinet 7 comprises a plurality of air inlets 15(1-n) for cooling purposes of the electric equipment, wherein ambient air is provided to the electric equipment positioned inside the cabinet 7 for cooling purposes. The air inlets 15(1-n) can comprise a plurality of stationary fins or louvers, for example for covering and protecting the air inlets 15(1-n).

Before an ambient air 9 enters the cabinet 7 and thus the electric device, the ambient air 9 is filtered. The cabinet 7 comprises one or more filter(s) (not seen). Under normal operating conditions of the electric device, the filter acts as a standard air filter, wherein particles and dust are filtered from the ambient air stream 9 to protect the electric equipment inside the cabinet 7.

In an exemplary embodiment, the filter comprises a rectangular design (see also FIG. 2), but can comprise many other shapes or forms as desired, wherein the cabinet 7 comprises an opening with a corresponding shape or form for receiving the filter. The filter can comprise an exemplary thickness T of about 3 (three) inches, but can comprise a thickness more or less than 3 inches. During an arc fault event in the cabinet 7, hot gases, plasma and debris do not vent out of the air inlets 15(1-n), as it can cause serious injury or death to personnel and property. Air filters do not break down as they do not have to filter these gases under an arc event.

The medium voltage drive 5 comprises three separate sections: a transformer section 10(1) at the bottom, a middle section 10(2), and a cells section 10(3) which also contains a central chimney (see FIG. 3) with double functionality: an air cooling and a plasma exhaust path. The medium voltage drive 5 is built such that a medium voltage section (where an arc fault can occur) is isolated from the plurality of air inlets 15(1-n) thus the arc fault plasma cannot reach the plurality of air inlets 15(1-n) present in the transformer section 10(1) and in the cells section 10(3) respectively. This prevents the hot plasma from escaping through air filters of the plurality of air inlets 15(1-n) and cause damage of various sorts. The middle section 10(2) of the medium voltage drive 5 and the central chimney can be built stronger to resist a high pressure of the arc fault while the rest of the medium voltage drive 5 can be built with regular strength panels and mechanical structures. In case the medium voltage drive 5 is made without an arc resistant feature, the strength of the middle section 10(2) and of the central chimney is kept to be at a normal level.

Figure 2:
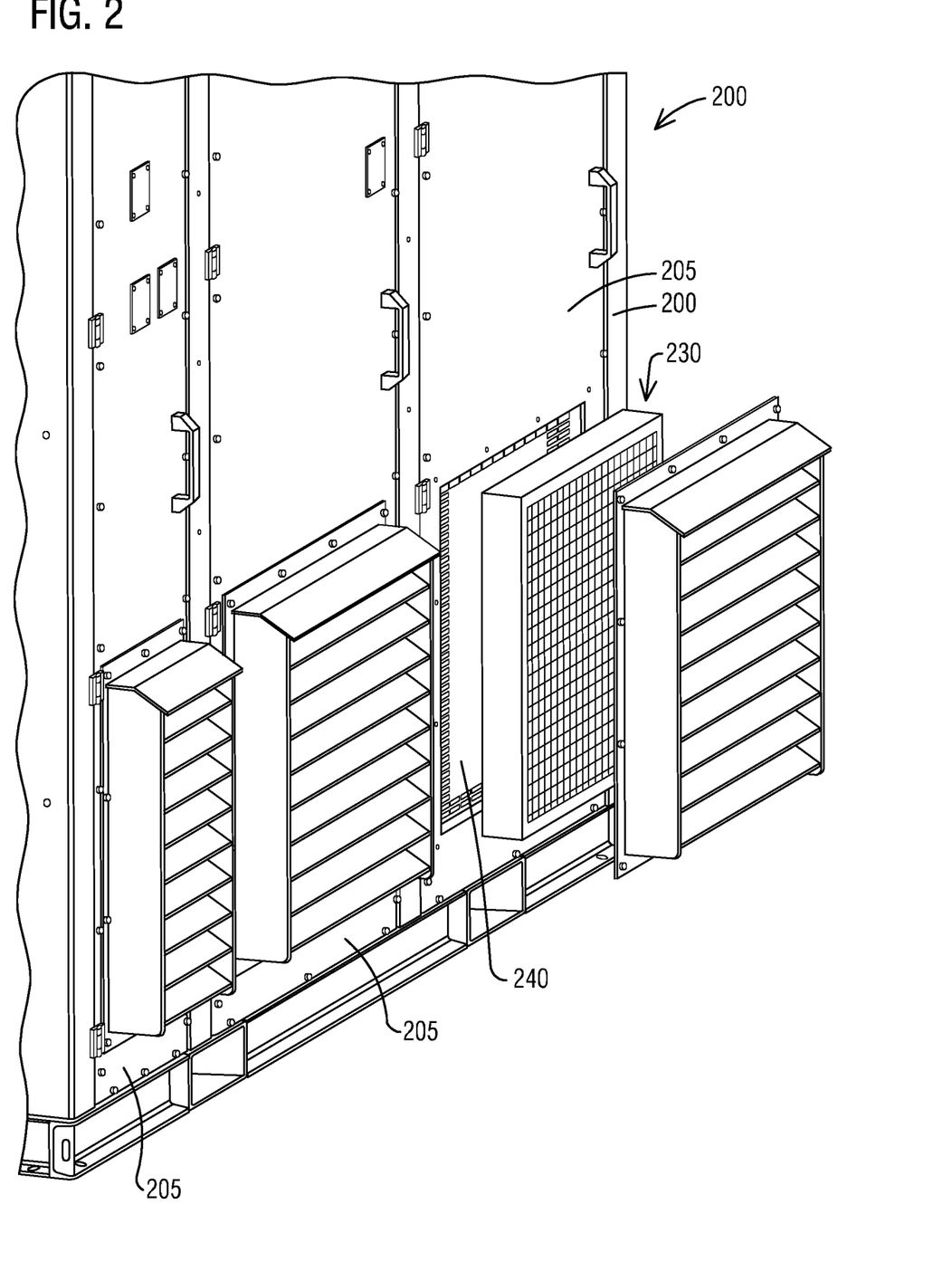
FIG. 2 illustrates a representation of a perspective view of a section of a cabinet or enclosure of a voltage drive in accordance with an exemplary embodiment of the present invention.

Referring to FIG. 2, it illustrates a representation of a perspective view of a section of a cabinet or enclosure of a voltage drive in accordance with an exemplary embodiment of the present invention. The medium voltage drive 5 of FIG. 1 can comprise multiple enclosures 200 adjacent to each other, wherein each enclosure 200 comprises multiple enclosure walls 205. At least one of the walls 205 of one or more enclosure(s) 200 comprises an opening 240 for receiving a filter 230. The filter(s) 230 are integrated into the enclosure walls 205. In our example, the enclosure walls 205 receiving the filters 230 are located at a front of the enclosures 200.

Figure 3:
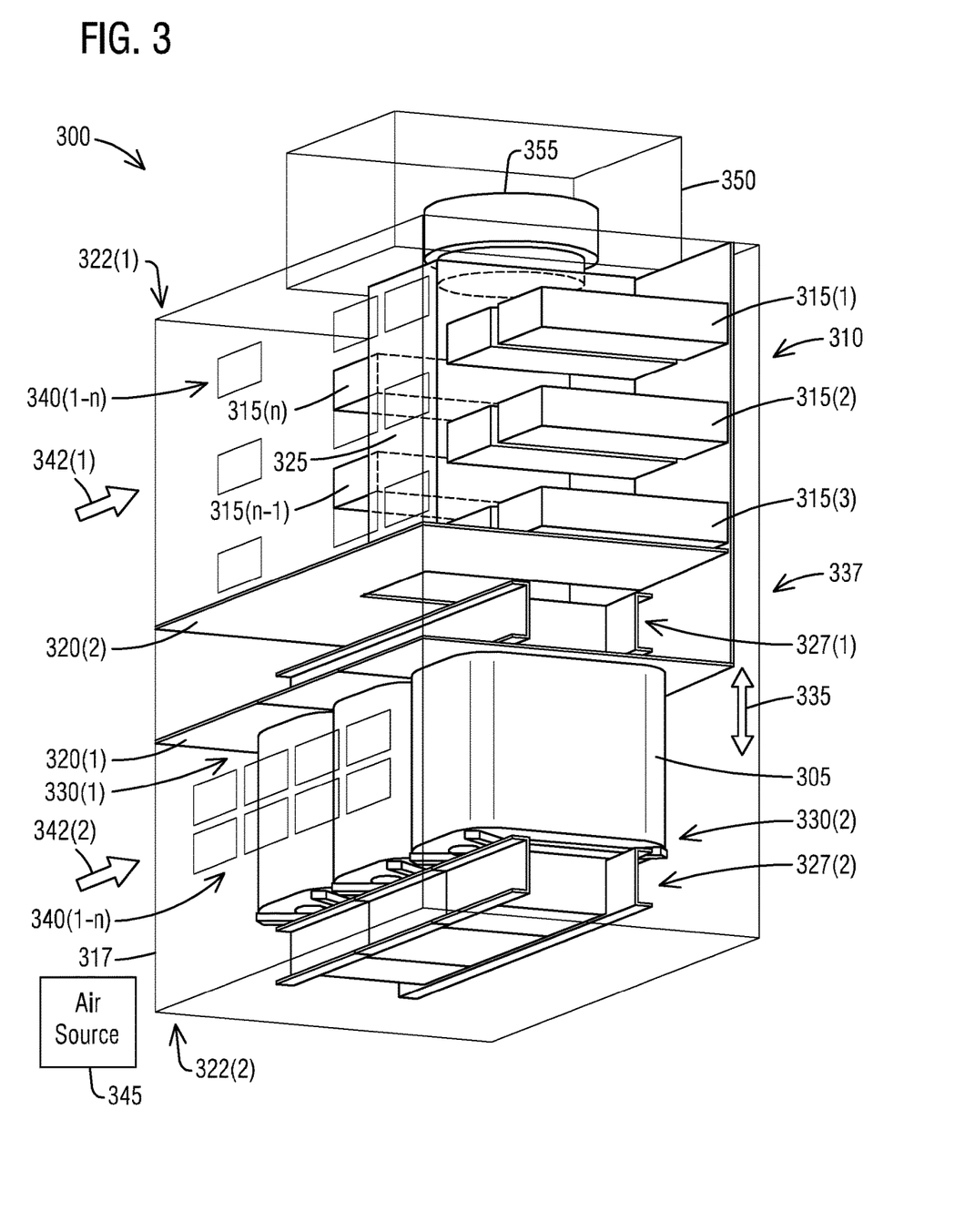
FIG. 3 illustrates a representation of a perspective see-through view of an air-cooled and an arc resistant medium voltage drive in accordance with an exemplary embodiment of the present invention.

Turning now to FIG. 3, it illustrates a representation of a perspective see-through view of an air-cooled and an arc resistant medium voltage drive 300 in accordance with an exemplary embodiment of the present invention. The air-cooled and an arc resistant medium voltage drive 300 comprises an isolation transformer 305 and a power converter 310. The isolation transformer 305 provides indeed isolation but more importantly it has multiple secondaries with phase shift between them such that the shape of input current is almost sinusoidal (small content of harmonics). The excellent quality of current absorbed from the grid is a very important feature.

A voltage drive is a device that is an Air-Cooled medium voltage variable frequency drive (VFD). A variable frequency drive is a type of adjustable-speed drive used in electro-mechanical drive systems to control AC motor speed and torque by varying motor input frequency and voltage. A variable frequency drive is a device used in a drive system consisting of the following three main sub-systems: AC motor, main drive controller assembly, and drive/operator interface. VFDs are made in a number of different low- and medium-voltage AC-AC and DC-AC topologies.

The power converter 310 comprises a plurality of power cells 315(1-n) which are indeed energy converters. They are supplied with energy from the isolation transformer 305 secondaries (50 Hz or 60 Hz depending on country), convert that to DC which is the converted in AC voltage at variable frequency and amplitude. Thus the power cell 315 has as power electronic components a rectifier, a DC link section and an inverter. These power cells 315(1-n) are then conveniently connected in series to provide a medium voltage for a motor of the application. The higher the voltage of the motor, the larger number of power cells 315 have to be connected in series for a given application.

The air-cooled and an arc resistant medium voltage drive 300 further comprises a cabinet 317 including a lower baffle 320(1) and an upper baffle 320(2). The cabinet 317 including an upper portion 322(1) and a lower portion 322(2). The air-cooled and an arc resistant medium voltage drive 300 further comprises a plurality of first power cells 315(1-$p$) disposed in the cabinet 317. The air-cooled and an arc resistant medium voltage drive 300 further comprises a plurality of second power cells 315(1-$k$) disposed in the cabinet 317. The air-cooled and an arc resistant medium voltage drive 300 further comprises a central chimney 325 vertically disposed in a space between the plurality of first power cells 315(1-$p$) and the plurality of second power cells 315(1-$k$).

The isolation transformer 305 is clamped between upper clamps 327(1) and lower clamps 327(2) while disposed in the cabinet 317 and being underneath the plurality of first power cells 315(1-$p$) and the plurality of second power cells 315(1-$k$). The isolation transformer 305 having a top end 330(1) and a bottom end 330(2). The air-cooled and an arc resistant medium voltage drive 300 further comprises a vertical plenum 335 disposed in a back 337 of the cabinet 317. The vertical plenum 335 is configured to flow cool air passing from the plurality of first power cells 315(1-$p$) and the plurality of second power cells 315(1-$k$) towards the bottom end 330(2) of the isolation transformer 305.

The lower baffle 320(1) is configured to prevent from flowing warm air from the isolation transformer 305 to the plurality of first power cells 315(1-$p$) and the plurality of second power cells 315(1-$k$). The lower baffle 320(1) may be a flat plate running around the isolation transformer 305. The upper baffle 320(2) is configured to force the warm air from the isolation transformer 305 and the cool air from the isolation transformer 305 into the central chimney 325. The upper baffle 320(2) may located above the lower baffle 320(1) and comprise a flat plate with a duct for passing air through the central chimney 325 vertically.

The upper portion 322(1) of the cabinet 317 further comprises a plurality of first inlets 340(1-$m$) for receiving a first cool air 342(1) from an air source 345 that is directed towards the plurality of first power cells 315(1-$p$) and the plurality of second power cells 315(1-$k$). The plurality of first inlets 340(1-$m$) further comprises a plurality of first air filters (not seen) for filtering the first cool air 342(1).

The lower portion 322(2) of the cabinet 317 further comprises a plurality of second inlets 340(1-$n$) for receiving a second cool air 342(2) from the air source 345 that is directed towards the isolation transformer 305. The plurality of second inlets 340(1-$n$) further comprises a plurality of second air filters (not seen) for filtering the second cool air 342(2).

The air-cooled and an arc resistant medium voltage drive 300 further comprises a blower cage 350 disposed over the upper portion 322(1) of the cabinet 317. The air-cooled and an arc resistant medium voltage drive 300 further comprises a blower 355 disposed in the blower cage 350. The blower 355 is configured to suck the warm air, the cool air and plasma generated in an arc fault event from the central chimney 325 and redirect the warm air and the cool air to out of the blower cage 350.

The blower 355 is hinged on one edge at the upper portion 322(1) of the cabinet 317 to swivel open to redirect the plasma out of the blower cage 350. The blower 355 includes an exhaust fan (not seen) powered up to provide a duct for the warm air, the cool air and the plasma to escape from the cabinet 317. The blower 355 is attached to the cabinet 317 with a plurality of nylon bolts which are configured to be broken by arc fault pressure for causing the blower 355 to swivel for plasma evacuation. The plasma does not reach the plurality of first power cells 315(1-$p$) and the plurality of second power cells 315(1-$k$) as the plasma finds an easy path through the central chimney 325 such that the blower 355 blows out the plasma from the cabinet 317 into an ambient environment.

Figure 4:
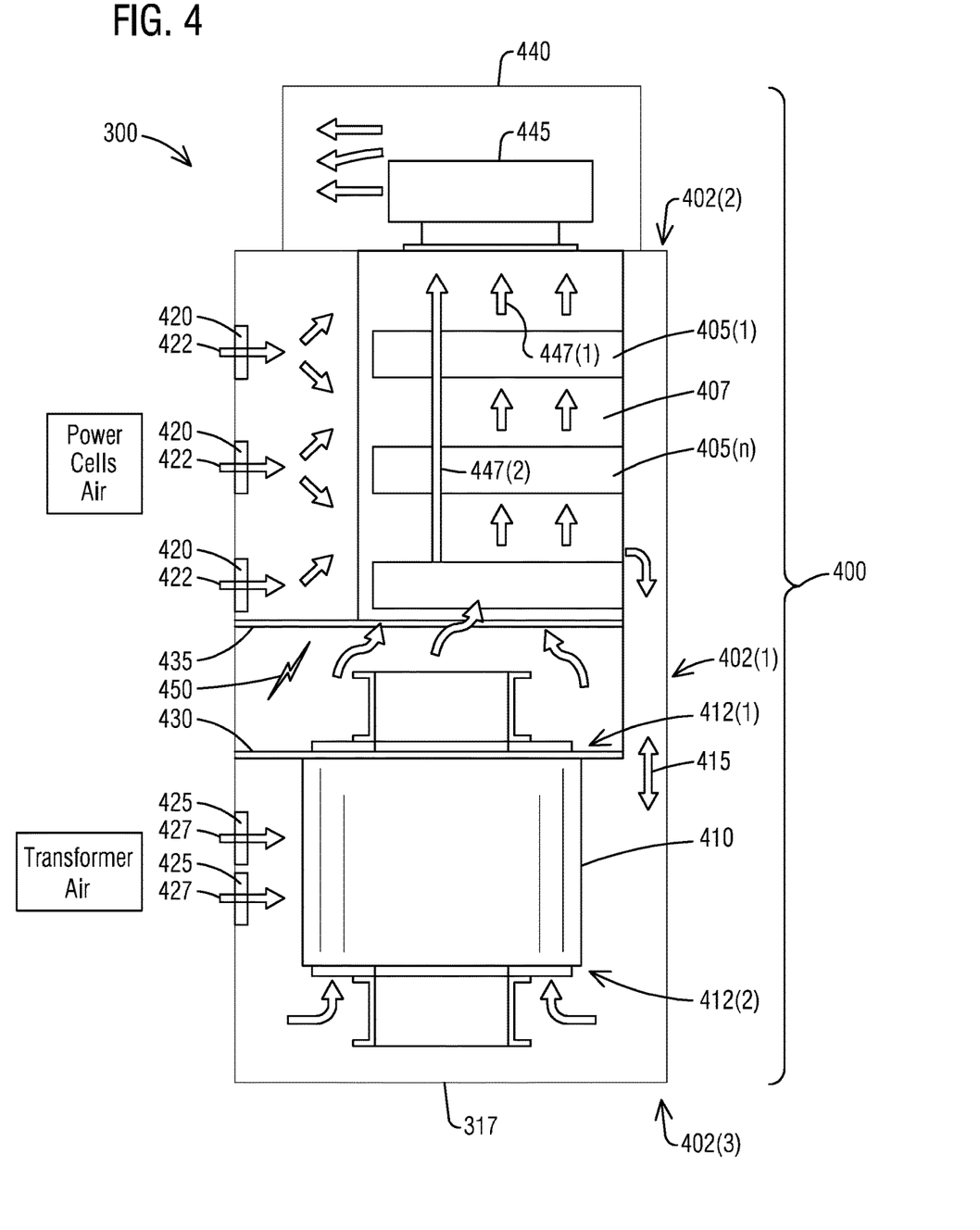
FIG. 4 illustrates a representation of a side view of the air-cooled and an arc resistant medium voltage drive of FIG. 3 with a portion of a cabinet or an enclosure removed in accordance with an exemplary embodiment of the present invention.

FIG. 4 illustrates a representation of a side view of the air-cooled and an arc resistant medium voltage drive 300 of FIG. 3 with a portion of the cabinet 317 or an enclosure removed in accordance with an exemplary embodiment of the present invention. The air-cooled and the arc resistant medium voltage drive 300 comprises an integrated air cooling and arc resistant system 400 for the voltage drive 300. The system 400 comprises the cabinet 317 including a back 402(1), an upper portion 402(2) and a lower portion 402(3). The system 400 further comprises a plurality of power cells 405(1-6) disposed in the cabinet 317. The system 400 further comprises a central chimney 407 vertically disposed in the cabinet 317. The system 400 further comprises a transformer 410 disposed in the cabinet 317 and being underneath the plurality of power cells 405(1-6). The transformer 410 has a top end 412(1) and a bottom end 412(2). The system 400 further comprises a vertical plenum 415 disposed in the back 402(1) of the cabinet 317. The vertical plenum 415 is configured to flow cool air passing from the plurality of power cells 405(1-6) towards the bottom end 412(2) of the transformer 410.

The upper portion 402(2) of the cabinet 317 further comprises a plurality of first inlets 420 for receiving a first cool air 422 from an air source (not shown) that is directed towards the plurality of power cells 405(1-6). The lower portion 402(3) of the cabinet 317 further comprises a plurality of second inlets 425 for receiving a second cool air 427 from the air source that is directed towards the transformer 410.

The system 400 further comprises a lower baffle 430 configured to prevent from flowing warm air from the transformer 410 to the plurality of power cells 405(1-6). The system 400 further comprises an upper baffle 435 configured to force the warm air from the transformer 410 and the cool air from the transformer 410 into the central chimney 407.

The system 400 further comprises a blower cage 440 disposed over the upper portion 402(2) of the cabinet 317. The system 400 further comprises a blower 445 disposed in the blower cage 440. The blower 445 is configured to suck warm air 447(1) from the transformer 410, cool air 447(2) passing from the plurality of power cells 405(1-6) and the transformer 410, and plasma 450 generated in an arc fault event through the central chimney 407 and redirect the warm air 447(1), the cool air 447(2) and the plasma 450 out of the blower cage 440.

In operation, the system 400 provides a more efficient air flow by taking the power electronics (e.g., the plurality of power cells 405(1-6)) cooling air and feeding it into the transformer 410. The transformer 410 has an additional cool air input which mixes with the somewhat warmer air from the plurality of power cells 405(1-6). This combined air flow gets into the central chimney 407 and is sucked by the blower 445 and expelled into the ambient at the top of the cabinet 317. Note that a system of baffles 430, 435 prevents the hotter air from the transformer 410 getting sucked into the plurality of power cells 405(1-6) which thus only use cool air from the ambient environment.

This solution creates in a mid part of the cabinet 317 a medium voltage section which is separated from the rest of the components by a structurally strong baffle system 430, 435 which aside from the air cooling role has a part to play when an arc fault is ignited in this region. The resulting plasma 450 cannot reach the power electronics (e.g., the plurality of power cells 405(1-6)) and the transformer 410 filters, instead it finds the easy path through the central chimney 407 and the blower 445 out of the cabinet 317. This solution requires that the mid section of the cabinet 317 be strong to resist the multi psi plasma 450 pressure waves which develop there. Also the central chimney 407 needs to be built with an adequate strength. The blower 445 is attached to its base with nylon bolts (not seen) and a hinge (not seen) such that the plasma 450 pressure can break the nylon bolts and the blower 445 can pivot around the hinge and allow thus an easier flow of the plasma 450 and control the max pressure developed in the cabinet 317 mid section, central chimney 407 and the blower cage 440. The system 400 provides an arc resistant option to voltage drives in addition to providing a more efficient air cooling solution which avoids the need to balance the air flow between the plurality of power cells 405(1-6) and the transformer 410.

While an integrated efficient air flow cooling and arc resistant system for a voltage drive is described here a range of other constructions of medium voltage power electronic equipment are also contemplated by the present invention. For example, other types of variable frequency drives (VFDs), a power supply or a circuit breaker may be implemented based on one or more features presented above without deviating from the spirit of the present invention.

Figure 5:
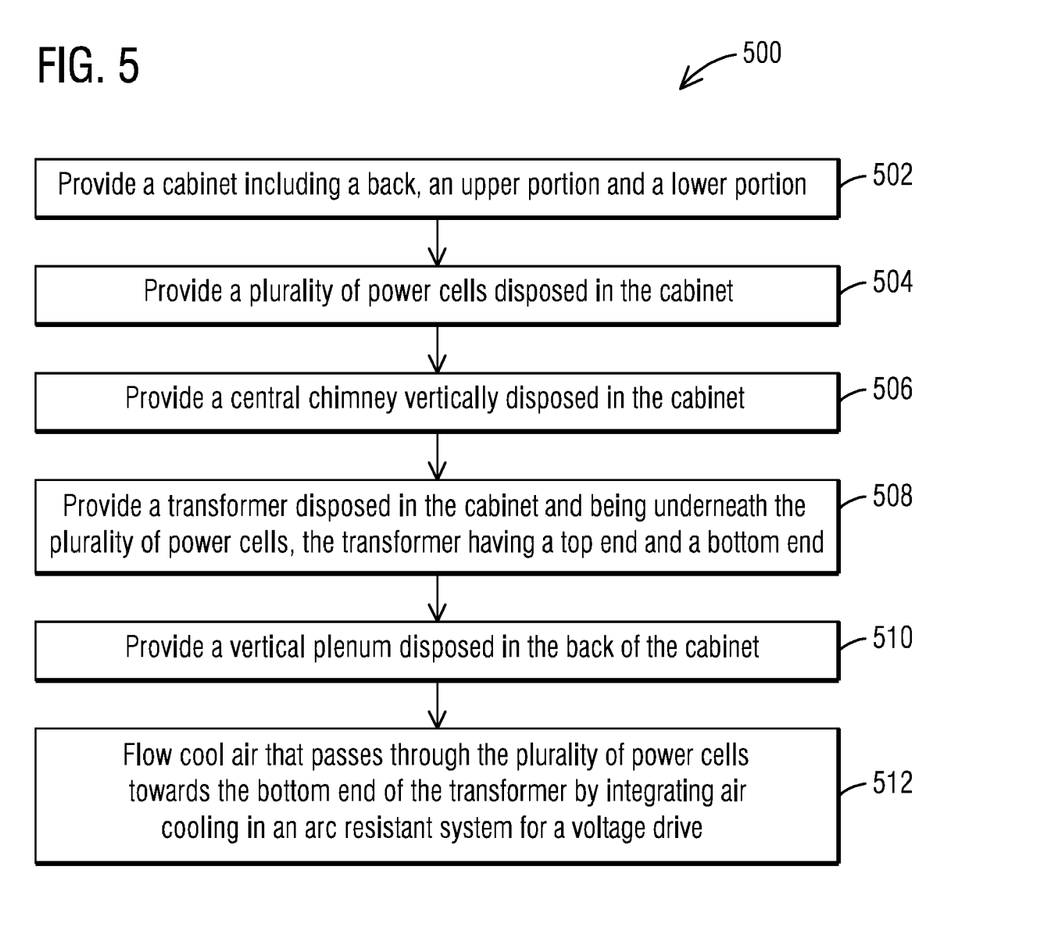
FIG. 5 illustrates a flow chart of a method of integrating air cooling in an arc resistant system for a voltage drive according to one exemplary embodiment of the present invention.

As seen in FIG. 5, it illustrates a flow chart of a method 500 of integrating air cooling in an arc resistant system for a voltage drive according to one exemplary embodiment of the present invention. The method 500 comprises providing a cabinet including a back, an upper portion and a lower portion in step 502. The method 500 further comprises providing a plurality of power cells disposed in the cabinet in step 504. The method 500 further comprises providing a central chimney vertically disposed in the cabinet in step 506. The method 500 further comprises providing a transformer disposed in the cabinet and being underneath the plurality of power cells in step 508. The transformer has a top end and a bottom end. The method 500 further comprises providing a vertical plenum disposed in the back of the cabinet in step 510. The method 500 further comprises flowing cool air that passes through the plurality of power cells towards the bottom end of the transformer in step 512.

The method 500 further comprises flowing from an air source a first cool air in a plurality of first inlets towards the plurality of power cells. The method 500 further comprises flowing from the air source a second cool air in a plurality of second inlets towards the transformer. The method 500 further comprises providing a blower cage disposed over the upper portion of the cabinet, providing a blower in the blower cage, sucking warm air from the transformer, cool air passing from the plurality of power cells and the transformer, and plasma generated in an arc fault event through the central chimney and redirecting the warm air, the cool air and the plasma out of the blower cage.

The techniques described herein can be particularly useful for a voltage drive. While particular embodiments are described in terms of the voltage drive, the techniques described herein are not limited to the voltage drive but can also be used for other power systems.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. An integrated air cooling and arc resistant system for a voltage drive, the system comprising:
    a cabinet including a lower baffle and an upper baffle, the cabinet including an upper portion and a lower portion;
    a plurality of first power cells disposed in the cabinet;
    a plurality of second power cells disposed in the cabinet;
    a central chimney vertically disposed in a space between the plurality of first power cells and the plurality of second power cells;
    a transformer clamped between upper clamps and lower clamps while disposed in the cabinet and being underneath the plurality of first power cells and the plurality of second power cells, the transformer having a top end and a bottom end; and
    a vertical plenum disposed in a back of the cabinet, the vertical plenum configured to flow cool air passing from the plurality of first power cells and the plurality of second power cells towards the bottom end of the transformer,
    wherein the lower baffle is configured to prevent warm air from flowing from the transformer to the plurality of first power cells and the plurality of second power cells, and
    wherein the upper baffle is configured to force the warm air from the transformer and the cool air from the transformer into the central chimney.

2. The system of claim 1, the upper portion of the cabinet further comprising:
    a plurality of first inlets for receiving a first cool air from an air source that is directed towards the plurality of first power cells and the plurality of second power cells.

3. The system of claim 2, the plurality of first inlets further comprising:
    a plurality of first air filters for filtering the first cool air.

4. The system of claim 2, wherein the lower portion of the cabinet further comprising:
    a plurality of second inlets for receiving a second cool air from the air source that is directed towards the transformer.

5. The system of claim 4, the plurality of second inlets further comprising:
    a plurality of second air filters for filtering the second cool air.

6. The system of claim 1, further comprising:
    a blower cage disposed over the upper portion of the cabinet; and
    a blower disposed in the blower cage, the blower configured to suck the warm air, the cool air and plasma generated in an arc fault event from the central chimney and to redirect the warm air and the cool air out of the blower cage.

7. The system of claim 6, wherein the blower is hinged at the upper portion of the cabinet to swivel open to redirect the plasma out of the blower cage.

8. The system of claim 6, wherein the blower includes an exhaust fan to provide a duct for the warm air, the cool air and the plasma to escape from the cabinet.

9. The system of claim 6, wherein the blower is attached to the cabinet with a plurality of nylon bolts which are configured to be broken by arc fault pressure for causing the blower to swivel for plasma evacuation.

10. The system of claim 6, wherein the plasma avoids the plurality of first power cells and the plurality of second power cells as the plasma finds an easy path through the central chimney such that the blower blows out the plasma from the cabinet into an ambient environment.

11. An integrated air cooling and arc resistant system for a voltage drive, the system comprising:
    a cabinet including a back, an upper portion and a lower portion;
    a plurality of power cells disposed in the cabinet;
    a central chimney vertically disposed in the cabinet;
    a transformer disposed in the cabinet and being underneath the plurality of power cells, the transformer having a top end and a bottom end;
    a vertical plenum disposed in the back of the cabinet, the vertical plenum configured to flow cool air passing from the plurality of power cells towards the bottom end of the transformer;
    a plurality of first inlets for receiving a first cool air from an air source that is directed towards the plurality of power cells;

a plurality of second inlets for receiving a second cool air from the air source that is directed towards the transformer; and a lower baffle configured to prevent warm air flowing from the transformer to the plurality of power cells.

12. The system of claim 11, further comprising:

an upper baffle configured to force the warm air from the transformer and the cool air from the transformer into the central chimney.

13. The system of claim 11, further comprising:

a blower cage disposed over the upper portion of the cabinet; and a blower disposed in the blower cage, the blower configured to suck warm air from the transformer, cool air passing from the plurality of power cells and the transformer, and plasma generated in an arc fault event through the central chimney and to redirect the warm air, the cool air and the plasma out of the blower cage.

\* \* \* \* \*